United States Patent [19]
Kim et al.

[11] Patent Number: 6,051,506
[45] Date of Patent: Apr. 18, 2000

[54] METHOD OF FABRICATION ULTRA-FREQUENCY SEMICONDUCTOR DEVICE

[75] Inventors: Song-Kang Kim, Seoul; Hyun-Ryong Cho, Kyoungki-do; Sung-Moo Lim, Kyoungki-do; Duck-Hyoung Lee, Kyoungki-do, all of Rep. of Korea

[73] Assignee: Hyundai Electronics Industries Co., Ltd., Kyoungki-do, Rep. of Korea

[21] Appl. No.: 08/883,201

[22] Filed: Jun. 26, 1997

[30]     Foreign Application Priority Data

Jun. 29, 1996 [KR] Rep. of Korea ............... 96-26304

[51] Int. Cl.⁷ .................................................. H01L 21/00
[52] U.S. Cl. ........................... 438/718; 438/738; 438/739
[58] Field of Search .................................. 438/718, 719, 438/720, 723, 724, 734, 738, 739, 742, 743, 744, 172, 182, 183

[56]           References Cited

U.S. PATENT DOCUMENTS

| | | | |
|---|---|---|---|
| 4,334,349 | 6/1982 | Aoyama et al. | 438/739 X |
| 4,959,326 | 9/1990 | Roman et al. | 437/40 |
| 5,160,408 | 11/1992 | Long | 438/739 X |
| 5,372,675 | 12/1994 | Wakabayashi et al. | 438/739 X |
| 5,648,294 | 7/1997 | Bayraktaroglu | 438/718 X |

FOREIGN PATENT DOCUMENTS

| | | |
|---|---|---|
| 61-12080 | 1/1986 | Japan . |
| 319241 | 1/1991 | Japan . |
| 3147337 | 6/1991 | Japan . |
| 4340231 | 11/1992 | Japan . |
| 6132317 | 5/1994 | Japan . |
| 6216209 | 8/1994 | Japan . |
| 6333956 | 12/1994 | Japan . |
| 774100 | 3/1995 | Japan . |
| 96-19599 | 6/1996 | Rep. of Korea . |

OTHER PUBLICATIONS

English translation of Abstract of JP 61–12080 (Jan. 20, 1986).
English translation of Abstract for KR 96–19599 (Jun. 17, 1996).
Patent Abstracts of Japan, Publication No. 06132317, May 13, 1994.
Translation of Purpose and Constitution of Japanese Laid–Open No. 3–147337, Jun. 24, 1991.
Translation of Purpose and Constitution of Japanese Laid–Open No. 3–19241, Jan. 28, 1991.
Translation of Purpose and Constitution of Japanese Laid–Open 4–340231, Nov. 26, 1992.
Patent Abstracts of Japan, Publicaton No. 07074100, Mar. 17, 1995.
Patent Abstracts of Japan, Publication No. 06216209, Aug. 5, 1994.
Patent Abstracts of Japan, Publicaton No. 06333956, Dec. 2, 1994.

*Primary Examiner*—William Powell
*Attorney, Agent, or Firm*—Ware, Fressola, Van Der Sluys & Adolphson LLP

[57]             ABSTRACT

A method for forming a T-shape gate having a length below 0.25 $\mu$m for use in ultra-frequency semiconductor devices is disclosed. The insulating layer is side-etched by using the gate mask pattern through a conventional photolithography, the length of the insulating layer being controlled by the side-etching. The length of the insulating layer determines the length of the T-shape gate for allowing the T-shape gate having the length below 0.25 $\mu$m to be obtained.

9 Claims, 4 Drawing Sheets

METHOD OF FABRICATION ULTRA-FREQUENCY SEMICONDUCTOR DEVICE

BACKGROUND OF THE INVENTION

1. Field of the Invention

The present invention relates to a method of fabricating a semiconductor device, and more particularly, to a method of fabricating a ultra-frequency semiconductor device having a T-shape gate with a fine line width.

2. Discussion of Related Art

As communications technology advances, ultra-frequency bands from 1 GHz to 100 GHz are becoming of greater importance in communication system. A metal-semiconductor field effect transistor (MESFET) based on GaAs is generally used as a high-frequency semiconductor device. Since the GaAs has higher electron mobility than Si, and its transition time is shorter, it has excellent high-frequency characteristic and stands well against higher temperatures. Furthermore, the GaAs has a relatively wide energy gap. Thus, a low-power GaAs amplifying device operating at a room temperature, has a small amount of heat generation and leakage current. Thus, it also resists well against noise.

In addition to the MESFET, as a device used in a ultra-frequency integrated circuit, there is a high electron mobility transistor (HEMT), which can be also referred to as modulation doped field effect transistor (MODFET). The HEMT is an improvement over the MESFET, wherein undoped GaAs is used as its channel so as to remove impurity dispersion and increase the electron mobility.

Meanwhile, in order to improve the high-frequency characteristic in the GaAs MESFET and HEMT, reduction of their gate lengths is required. It is very difficult, however, to form a gate pattern having a length below 0.25 $\mu$m using conventional I-line photolithography which is usually used for forming a mask pattern of above 1 $\mu$m. To compensate for this problem, electron beam lithography is employed to form the gate pattern below 0.25 $\mu$m. This method, however, increases the production cost, and decreases throughput due to its longer process time.

SUMMARY OF THE INVENTION

Accordingly, the present invention is directed to a method of fabricating a ultra-frequency semiconductor device that substantially obviates one or more of the problems due to limitations and disadvantages of the related art.

An object of the present invention is to provide a method of fabricating a ultra-frequency semiconductor device, which forms a T-shape gate having a length of below 0.25 $\mu$m using a conventional photolithography, to thereby improve throughput.

To achieve these and other advantages and in accordance with the purpose of the present invention, as embodied and broadly described, the method of fabricating a semiconductor device includes the steps of: sequentially forming a first layer, insulating layer and second layer on a semiconductor substrate; forming a gate mask pattern on the second layer; etching the second layer and insulating layer using the gate mask pattern as an etching mask; side-etching the etched insulating layer using the gate mask pattern as an etching mask, to control the length of the insulating layer to a predetermined length; removing the gate mask pattern; forming a photoresist layer on the overall surface of the substrate to expose the surface of the second layer; removing the second layer, insulating layer and first layer using the photoresist layer as an etch mask, to expose a predetermined portion of the substrate; etching the exposed portion of the substrate to a predetermined depth, to form a T-shape recess; forming a gate material layer on the photoresist layer, to bury the T-shape recess; forming a gate mask pattern on the gate material layer; etching the gate material layer using the mask pattern as an etching mask, to form a T-shape gate; and removing the mask pattern, photoresist layer and first layer.

The semiconductor substrate is a compound semiconductor substrate. The first and second layers are identical material composition, and the insulating layer has a wide range of etch selectivity to the first and second layers.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

DETAILED DESCRIPTION OF THE INVENTION

Reference will now be made in detail to the preferred embodiments of the present invention, examples of which are illustrated in the accompanying drawings.

Figure 1A:
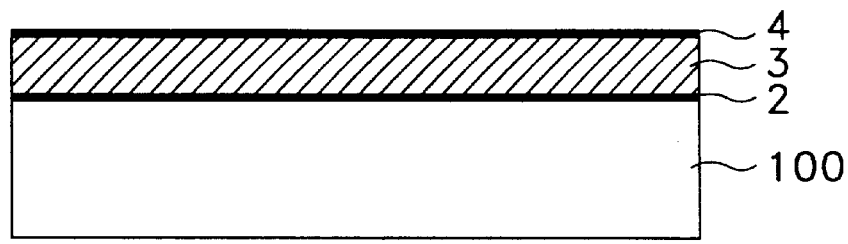
FIGS. 1A to 1J are cross-sectional views showing a method of fabricating a ultra-frequency semiconductor device according to an embodiment of the present invention.
Figure 1B:
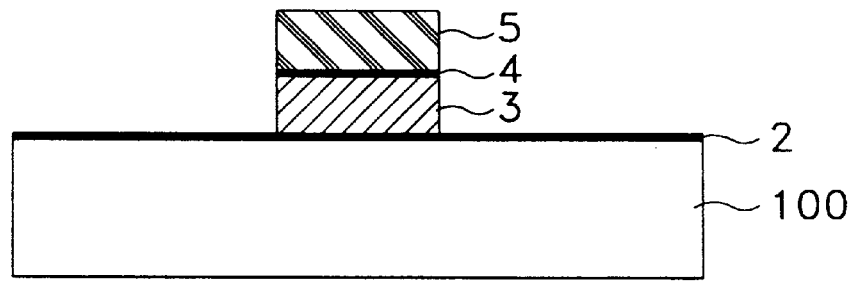
Figure 1C:
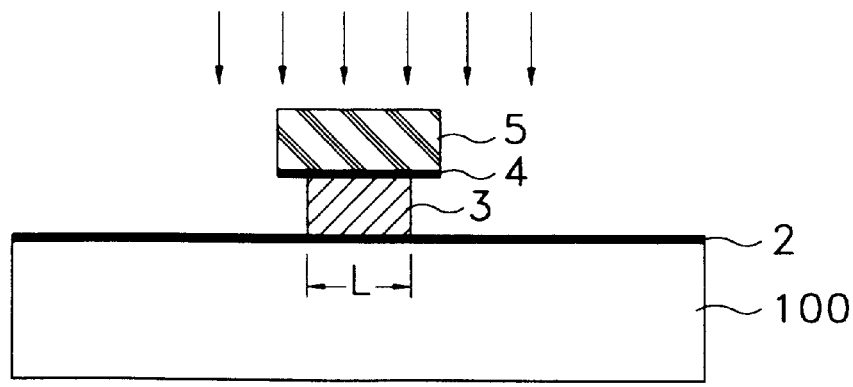
Figure 1D:
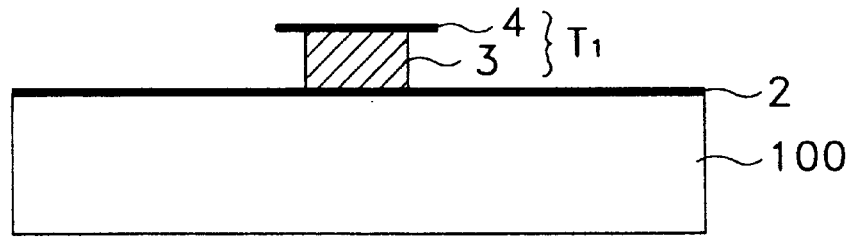
Figure 1E:
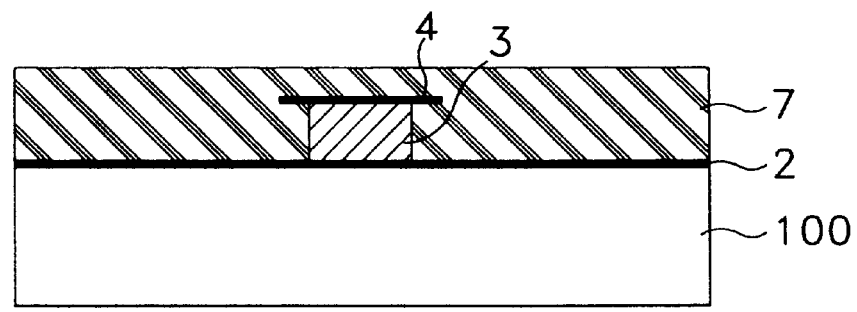
Figure 1F:
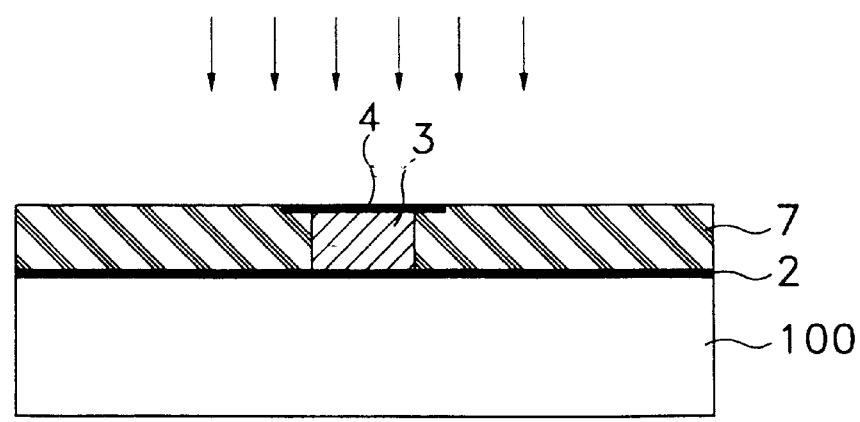
Figure 1G:
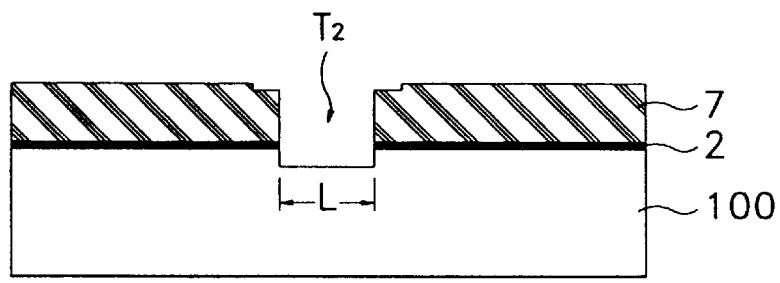
Figure 1H:
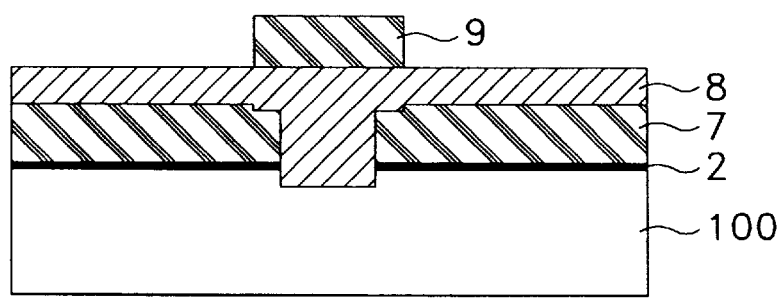
Figure 1I:
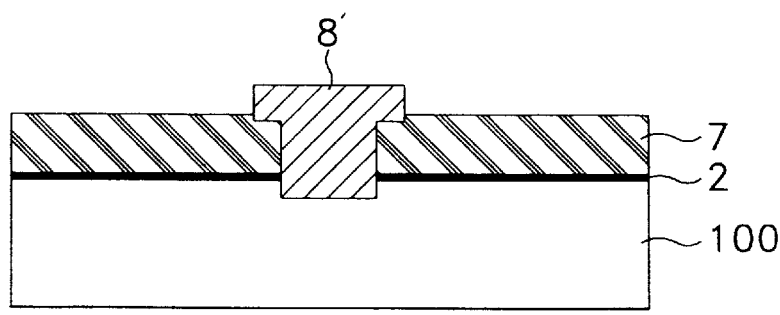
Figure 1J:
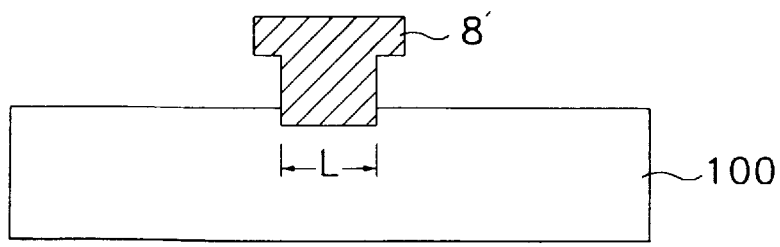
Figure 2:
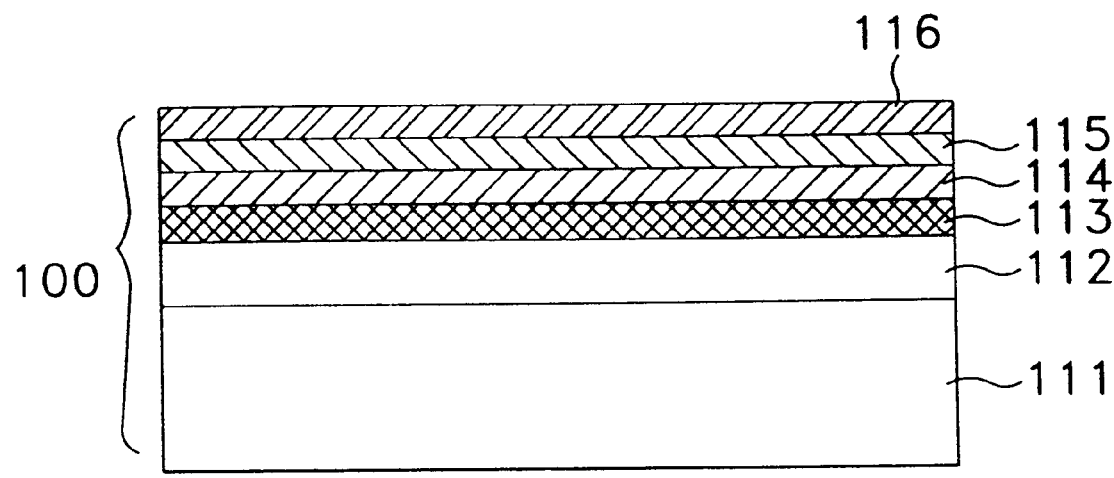
FIG. 2 is a cross-sectional view of P-HEMT substrate according to an embodiment of the present invention.
Figure 3:
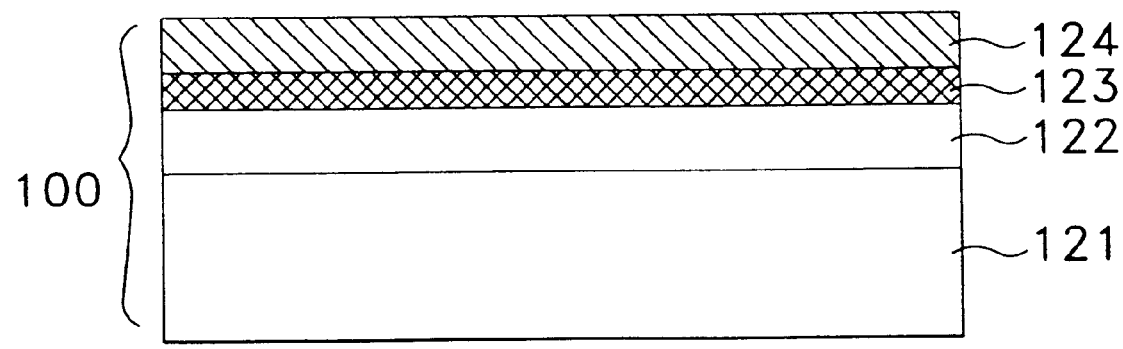
FIG. 3 is a cross-sectional view of MESFET substrate according to an embodiment of the present invention.

FIGS. 1A to 1J are cross-sectional views showing a method of fabricating a ultra-frequency semiconductor device according to an embodiment of the present invention, FIGS. 2 and 3 are cross-sectional views of the substrate structures used in the semiconductor device of FIGS. 1A to 1J. Referring to FIG. 1A, a first layer 2, insulating layer 3 and second layer 4 are sequentially formed on a compound semiconductor substrate 100.

The compound semiconductor substrate 100 may be P-HEMT or MESFET substrate. Referring to FIG. 2, P-HEMT compound semiconductor substrate 100 is formed in such a manner that a GaAs buffer layer 112, insulating InGaAs active layer 113, insulating AlGaAs spacer layer 114, n-AlGaAs carrier supply layer 115 for supply carriers and n-GaAs ohmic contact layer 116 are sequentially formed on a semi-insulating GaAs substrate 111. Referring to FIG. 3, MESFET compound semiconductor substrate 100 is formed in such a manner that an insulating GaAs buffer layer 122, n-GaAs active layer 123, and n$^+$-GaAs ohmic contact layer 124 are sequentially formed on a semi-insulating GaAs substrate 121.

The insulating layer 3 has a wide range of etch selectivity to the first and the second layers 2 and 4. Preferably, the insulating layer 3 is SiN layer or SiO$_2$ layer, and the first and second layers 2 and 4 are Ni layer.

Referring to FIG. 1B, a gate mask pattern 5 is formed on second layer 4 through photolithography. The width of mask pattern 5 is approximately 1 μm. The second layer 4 and insulating layer 3 are etched by etching process using mask pattern 5 as an etch mask. Referring FIG. 1C, the insulating layer 3 is side-etched through an etching process, preferably, reactive ion etching (RIE). This side-etching is carried out to provide the length L of the insulating layer below 0.25 μm. The length L of insulating layer 3 can be controlled by the side-etching process. The length L of the insulating layer obtained after the side-etching is formed to be as long as the T-shape gate to be formed in the following process, and the second layer 4 determines the top width of the T-shape gate. The first layer 2 protects the substrate 100 from being damaged when the insulating layer 3 is etched through RIE.

Referring to FIG. 1D, mask pattern 5 is removed, leaving a T-shape structure T1 on substrate 100. Referring to FIG. 1E, a photoresist layer 7 is coated to bury the T-shape structure T1, and then etched through RIE, to expose the surface of the second layer 4 as shown in FIG. 1F.

Referring to FIG. 1G, exposed second layer 4, insulating layer 3 and first layer 2 are etched, to thereby expose a predetermined portion of the substrate 100. The exposed portion of the substrate 100 is recessed to a predetermined depth by an etching process. Thus, a recess T2 of T-shape structure having length L of below 0.25 μm is formed on the substrate 100.

Referring to FIG. 1H, a gate material 8 is deposited on the overall surface of the substrate, to fill recess T2, and a gate mask pattern 9 is then formed on the gate material 8. Referring to FIG. 1I, the gate material layer 8 is etched by an etching process using the mask pattern 9, to expose the photoresist layer 7. Thereafter, the mask pattern 9 is removed. Referring to FIG. 1J, the photoresist layer 7 and first layer 2 are sequentially removed, forming a T-shape gate 8' having length L below 0.25 μm.

According to the embodiment of the present invention, insulating layer 3 is side-etched using the gate mask pattern through a conventional photolithography, and the length of the side-etched insulating layer determines the length of the T-shape gate. Thus, the T-shape gate having the length of below 0.25 μm can be formed. Accordingly, the gate pattern with a fine line width in which the width becomes wider but length becomes shorter is formed through a conventional photolithography. This improves high-frequency characteristic, increases the throughput and decreases production cost.

It will be apparent to those skilled in the art that various modifications and variations can be made in the method of fabricating a high-frequency semiconductor device of the present invention without departing from the spirit or scope of the invention. Thus, it is intended that the present invention cover the modifications and variations of this invention provided they come within the scope of the appended claims and their equivalents.

What is claimed is:

1. A method of fabricating a semiconductor device, comprising the steps of:

sequentially forming a first layer, insulating layer and second layer on a semiconductor substrate;

forming a gate mask pattern on the second layer;

etching the second layer and insulating layer using the gate mask pattern as an etching mask;

side-etching the etched insulating layer using the gate mask pattern as an etching mask, to control the length of the insulating layer;

removing the gate mask pattern;

forming a photoresist layer on the overall surface of the substrate, to expose the surface of the second layer;

removing the second layer, insulating layer and first layer using the photoresist layer as an etch mask, to expose a portion of the substrate;

etching the exposed portion of the substrate to form a T-shape recess;

forming a gate material layer on the photoresist layer, to bury the T-shape recess;

forming a gate mask pattern on the gate material layer;

etching the gate material layer using the mask pattern as an etching mask, to form a T-shape gate; and removing the mask pattern, photoresist layer and first layer.

2. The method of fabricating a semiconductor device as claimed in claim 1, wherein the semiconductor substrate is a compound semiconductor substrate.

3. The method of fabricating a semiconductor device as claimed in claim 2, wherein the compound semiconductor substrate is formed in such a manner that a GaAs buffer layer, InGaAs active layer, AlGaAs spacer layer, n-AlGaAs carrier supply layer and n-GaAs ohmic contact layer are sequentially formed on a GaAs substrate.

4. The method of fabricating a semiconductor device as claimed in claim 2, wherein the compound semiconductor substrate is formed in such a manner that a GaAs buffer layer, n-GaAs active layer and $n^+$-GaAs ohmic contact layer are sequentially formed on a GaAs substrate.

5. The method of fabricating a semiconductor device as claimed in claim 1, wherein the first and second layers are identical, and insulating layer has a wide range of etch selectivity to the first and second layers.

6. The method of fabricating a semiconductor device as claimed in claim 5, wherein the insulating layer is one of SiN layer or $SiO_2$ layer.

7. The method of fabricating a semiconductor device as claimed in claim 6, wherein the first and second layers are Ni layer.

8. The method of fabricating a semiconductor device as claimed in claim 1, wherein the side-etching is performed by RIE.

9. The method of fabricating a semiconductor device as claimed in claim 1, wherein the step of forming the photoresist layer comprises the substeps of:

coating a photoresist layer on the overall surface of the substrate, to bury the insulating layer and second layer; and removing the photoresist layer to expose the surface of the second layer.

* * * * *

UNITED STATES PATENT AND TRADEMARK OFFICE
CERTIFICATE OF CORRECTION

PATENT NO.    : 6,051,506
DATED         : April 18, 2000
INVENTOR(S)   : S. Kim et al It is certified that error appears in the above-identified patent and that said Letters Patent is hereby corrected as shown below:

Title page, item [54],
Line 1, please cancel "FABRICATION" and substitute -- FABRICATING -- therefor.

Column 1,
Line 1, please cancel "FABRICATION" and substitute -- FABRICATING -- therefor.

Signed and Sealed this

Twenty-third Day of October, 2001

Attest:

*Nicholas P. Godici*

NICHOLAS P. GODICI
*Attesting Officer*    *Acting Director of the United States Patent and Trademark Office*